United States Patent [19]

Ong et al.

[11] 4,198,698
[45] Apr. 15, 1980

[54] CHIP SELECT POWER-DOWN CONTROL CIRCUITRY

[75] Inventors: Warren R. Ong, San Francisco; Walford Ho, Saratoga, both of Calif.

[73] Assignee: Fairchild Camera and Instrument Corporation, Mt. View, Calif.

[21] Appl. No.: 966,985

[22] Filed: Dec. 6, 1978

[51] Int. Cl.² .................................................. G11C 7/02
[52] U.S. Cl. ..................................... 365/226; 307/125; 307/238; 365/228
[58] Field of Search ................. 307/254, 238, DIG. 1, 307/125, 126; 365/226, 227, 228, 229

[56] References Cited

U.S. PATENT DOCUMENTS

| | | | |
|---|---|---|---|
| 3,703,710 | 11/1972 | Kubo et al. | 365/226 |
| 4,104,734 | 8/1978 | Herndon | 365/228 |

Primary Examiner—Stuart N. Hecker
Attorney, Agent, or Firm—Alan H. MacPherson; Paul J. Winters; Robert C. Colwell

[57] ABSTRACT

Circuitry responsive to a memory chip de-select signal for very rapidly decoupling the memory from its peripheral circuits and for turning off all unnecessary power and, upon occurrence of a chip select signal, for rapidly restoring power and then recoupling the memory after a preselected word line voltage is reached and all transients have subsided, thereby preventing erroneous writing and reading during chip select and deselect.

9 Claims, 1 Drawing Figure

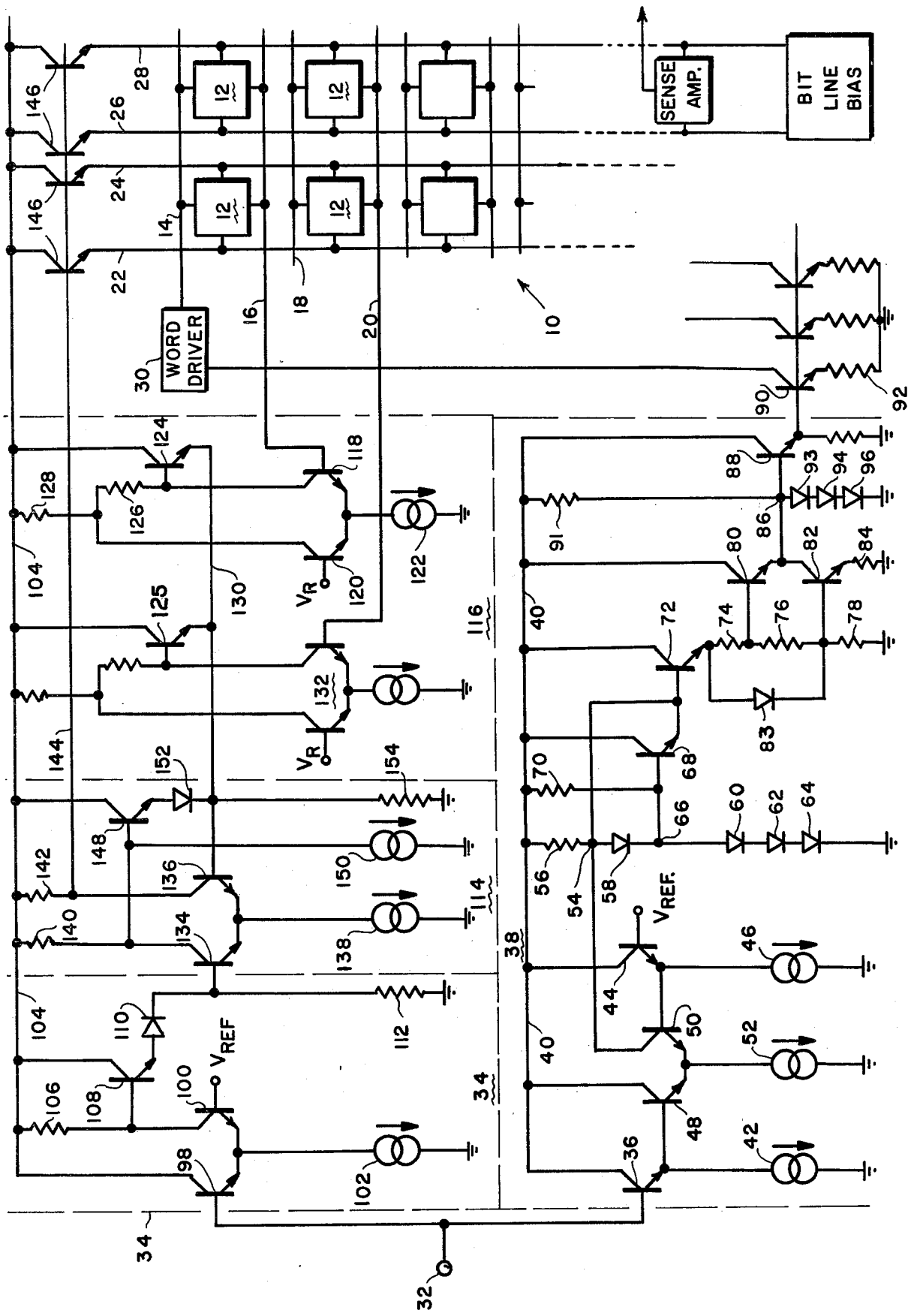

CHIP SELECT POWER-DOWN CONTROL CIRCUITRY

SUMMARY OF THE INVENTION

This invention relates to power savings and protection circuitry for digital circuits and particularly to high-speed circuitry for controlling the power-up and power-down and decoupling sequence during the selection and deselection of controlled circuits, such as a random access memory circuit chip, to prevent erroneous writing and reading of the memory during the transient switching period.

In volatile matrix memories, such as the high-speed ECL random access memory, data are read from and written into the cells by selectively varying the voltages on the appropriate word and bit lines of the matrix. The word and bit driver circuits coupled to each word and bit line are therefore designed to apply the precise voltage levels when a particular cell is both selected and de-selected, since very small voltage variations may cause an accidental and erroneous writing or reading.

Existing drive circuits provide the required tasks quite efficiently and accurately, except during the short transient periods when an entire bipolar memory chip, including the drivers, sense amplifiers, etc., is being selected or de-selected. Even though the chip may include data retention circuitry to preserve data during de-selected periods, transients generated during the switchover can momentarily change voltages that may alter the stored data.

The circuitry of the invention can control the power-down and power-up of circuits such as ECL gates and memories and their associated circuits in response to a chip select or de-select input signal. Briefly described, the circuitry of the invention is comprised of four sub-circuits: A current source de-bias circuit coupled to remove the bias from various peripheral circuits such as drivers, decoders, input buffers, sensor circuits, etc., in response to a chip de-select input signal; a chip select input gate responsive to the input signal; a word line sensor circuit; and an inverter/latch circuit coupled to both the chip select input gate and the word line sensor for controlling a coupling between the memory bit lines and the peripheral circuits.

Upon de-selection of the memory chip, the input gate and inverter/latch circuits rapidly respond to decouple the memory array from the peripheral circuits within approximately four nanoseconds. Simultaneously, the de-biasing circuitry removes power from the peripheral circuits by de-biasing their respective current sources.

Upon selection of the chip, the current source de-bias circuitry permits the peripheral circuit current sources to be re-biased, thereby causing most voltage levels to return to their operating levels. However, during this transient period, the bit lines are maintained at a high decoupling level by the inverter/latch until the low word line sensing circuit detects a falling word line of a predetermined voltage level. When this occurs, the inverter/latch releases the bit line from the $V_{cc}$ source, thereby enabling the memory until the next chip de-select cycle.

DESCRIPTION OF THE DRAWING

The single drawing is a schematic circuit diagram of the preferred embodiment of the control circuitry of the invention.

DETAILED DESCRIPTION OF THE PREFERRED EMBODIMENT

Illustrated in the schematic diagram is a portion of a typical matrix memory 10, such as a bipolar random access memory having a plurality of memory cells 12 shown to be coupled between horizontal word line pairs 14, 16, 18 and 20 and between vertical bit line pairs 22, 24, 26 and 28. The upper word lines, such as word lines 14 and 18, are typically coupled to word drivers, such as the driver 30 on the word line 14, and the bit lines are typically coupled to bit drivers and sense amplifiers (not shown). The lower word lines are generally coupled to cell current sink circuits (not shown) that provide the necessary low standby power for retaining stored data during unaddressed periods of the memory.

In the circuitry of the invention, a negative-going chip select signal, or a positive-going de-select signal, is applied to the input terminal 32. Terminal 32 is coupled to the chip select gate 34 and to the base of an NPN transistor 36 in the de-biasing circuit 38. The collector of transistor 36 is coupled to a $V_{cc}$ source conductor 40 and the emitter is coupled through a constant current source 42 to ground reference. The constant current source 42 may, if desired, be merely a resistance, or may be any of the other acceptable and well-known constant current circuits.

Also coupled between source conductor 40 and ground reference is an NPN transistor 44, the base of which is connected to an input reference voltage and the emitter of which is coupled to ground reference through a current source 46 which is identical to the current source 42. The emitters of transistors 36 and 44 are respectively coupled to the base electrodes of NPN transistors 48 and 50, the connected emitters of which are coupled through constant current source 52 to the negative or ground reference. The collector of transistor 48 is connected directly to source conductor 40 and the collector of transistor 50 is connected to the point 54, which is coupled to conductor 40 through a resistance 56. The point 54 is coupled to ground reference through a string of four diodes 58, 60, 62 and 64 connected in series. Thus, resistance 56 and diodes 58–64 comprise a voltage reference circuit and, absent the effect of subsequent circuitry yet to be described, the point 54 would be clamped at a voltage level of $4V_{be}$, or approximately 2.8 volts when transistor 50 is off and drops to a low voltage level when transistor 50 is on.

In the description that follows, the term $V_{be}$, the base to emitter junction voltage of a transistor or diode will simply be referred to as $\phi$, so that a base to emitter voltage of less than $1\phi$ will render a transistor non-conductive and a base value of $1\phi$ or greater will turn the transistor on to render it conductive.

The junction 66 between the cathode of the diode 58 and the anode of diode 60 is connected to the base of NPN transistor 68 and to the conductor 40 through a resistance 70. The collector of transistor 68 is connected to the conductor 40 and the emitter is connected to the base of NPN transistor 72 and also connected back to the point 54 at the top of the previously described diode string. Therefore, when transistor 50 becomes conductive, the point 54 will rapidly drop from its high level of $4\phi$ to the point where the emitter of transistor 68 is $1\phi$ lower than the base voltage, and since the base voltage is always maintained at a voltage level of $3\phi$ by the voltage reference established by resistance 70 and diodes 60, 62 and 64 in series, the transistor 68 will become conductive when the point 54 drops to a level of 2φ. Thus, when transistor 50 is non-conductive, point 54 maintains a level of 4φ and transistor 68 is nonconductive. When transistor 50 becomes conductive, the point 54 is maintained at a level of 2φ by the conduction of transistor 68.

The emitter of transistor 68 is coupled to the base of an NPN transistor 72, which is always conducting. The collector of transistor 72 is connected to the source conductor 40 and the emitter of which is connected to ground reference through series resistors 74, 76 and 78. The junction of resistors 74 and 76 is connected to the base of NPN transistor 80 and the junction of resistors 76 and 78 is connected to the base of NPN transistor 82. Resistors 74 and 76 are bypassed by a diode 83 which clamps the voltage across the series resistors 74 and 76 at a level of 1φ. The resistors 74 and 76 form a voltage divider in which approximately 0.2φ is dropped across the resistance 74 while 0.8φ is dropped across resistor 76. The value of resistor 78 is sufficiently low to cause conduction of transistor 72 and diode 83 so that the high 4φ level at point 54 will result in the junction of resistors 76 and 78 to be a level of 2φ. Therefore, the junction of resistors 74 and 76 and hence the base of transistor 80 is at a level of 2.8φ, and transistor 82 is on. Conversely, when the low 2φ level is applied to the base of transistor 72, its emitter voltage drops to 1φ and transistor 82 is off.

NPN transistors 80 and 82 are connected in series so that the collector of transistor 80 is coupled to the source conductor 40 and the collector of transistor 82 is coupled to the emitter of transistor 80. The emitter of transistor 82 is coupled to ground through a resistance 84. The emitter-collector junction of transistors 80 and 82, respectively, are connected to the point 86, and is also connected to the base of NPN transistor 88. Point 86 is connected to the source conductor 40 through a resistance 91 and to ground through a series string of diodes 93, 94 and 96. When transistors 80 and 82 are rendered non-conductive by the low voltage at the emitter of transistor 72, the resistance 91 and diodes 93-96 form a voltage reference that maintains the point 86 at a voltage level of 3φ. On the other hand, when transistors 80 and 82 are conductive, the diodes are shunted by the transistor 82 in series with the resistor 84 so that the point 86 drops from a level of 3φ to a level of 1φ below the level on the base of transistor 80, or at approximately 1.8φ.

The emitter of transistor 88 is connected to the bases of a plurality of current source transistors 90 that are connected to various memory circuits, such as the word driver 30. Thus, when the base of transistor 88 is at the high 3φ level, the current source transistors, such as transistor 90, become conductive to provide the word driver 30 with current. When the base of transistor 88 is at its low 1.8φ level, its emitter, at a 0.8φ level, switches off the current source transistors.

Very briefly reviewing the logical levels of the previous circuitry, a high level de-select signal applied to input terminal 32 will render transistor 36 conductive and a high level is applied to the base of transistor 48 rendering it conductive and transistor 50 non-conductive. This raises point 54 to its high lvel so that transistor 68 is off and transistor 72 applies a 2.8φ level to the base of transistor 80 and 2.0φ to the base of transistor 82, rendering these transistors conductive. Conduction of transistors 80 and 82 clamps the level of point 86 from its normal 3φ level to a level of 1.8φ and the emitter of transistor 88, which is always on, will drop from the 2φ level to the level of 0.8φ to switch off the current source transistors, such as transistor 90.

CHIP SELECT GATE

Input terminal 32 is coupled to the base of NPN transistor 98 in the chip select gate 34. The emitter of transistor 98 is connected to the emitter of a corresponding NPN transistor 100 and the coupled emitters are connected to ground reference through a current source 102. The base of transistor 100 is connected to an input reference voltage source and the collector is connected to a $V_{cc}$ source conductor 104 through a resistance 106. The collector of transistor 98 is also connected directly to the source conductor 104. The collector of transistor 100 is connected to the base of NPN transistor 108, the collector of which is connected to source conductor 104 and the emitter of which is connected to the anode of diode 110, the cathode of which is connected through a resistance 112 to ground reference. The transistor 108 with diode 110 forms a level shifter that drops the voltage level a total of 2φ.

During selection of the chip including the memory 10, the signal applied to input terminal 32 is at a low level, rendering transistor 98 non-conductive and transistor 100 conductive. This places a low base voltage on transistor 108, which is always on. A high level "deselect" signal applied to the input terminal 32 will turn on transistor 98 to render transistor 100 non-conductive. This lifts the collector of transistor 100 and the base of transistor 108 to a high level. The output from the chip select gate 34 is taken from the cathode of the diode 110 and is applied to the inverter/latch that will subsequently be explained in detail.

WORD LINE SENSORS

The word line sensors 116 directly measure the voltage levels on any two of the lower word lines 16 and 20, one of which is always in a low voltage unaddressed state during normal operation of the memory. One lower word line, such as word line 16, is coupled to the base of an NPN transistor 118, the emitter of which is coupled to the emitter of transistor 120 and through a constant current source 122 to ground reference. The collector of transistor 118 is connected to the base of NPN transistor 124 and also coupled through resistance 126 to the collector of the transistor 120. This junction is coupled through a resistance 128 to the voltage source conductor 104. The base of transistor 120 is coupled to a reference voltage that maintains transistor 120 in its conductive state until the voltage level on word line 16 increases above the reference voltage level. When transistor 118 is off because of a word line voltage that is lower than the reference voltage on transistor 120, the current through resistance 128 and the conducting transistor 120 are designed to maintain the junction of resistors 128 and 126, and hence the base of transistor 124 at a level of $-1.4\phi$, or 1.4φ below the level on the $V_{cc}$ source conductor 104. When transistor 118 is turned on by the increased word line voltage, the current through resistance 126 drops the voltage on its collector and hence the base of transistor 124 to its low level of $-2.4\phi$.

The lower word line 20 is coupled to an identical ECL gate circuit 132, the operation of which is identical with the circuit described above and which is also connected to the word line sensor output conductor 130.

INVERTER/LATCH

Inverter/latch 114 is coupled to the output of the chip select gate 34 and to the output conductor 130 of the word line sensors 116. In response to a high chip de-select input signal at the input terminal 32 of the circuitry, the chip select gate 34 outputs a high level signal that turns on the pull-up transistors that connect the memory bit lines to the $V_{cc}$ source conductor 104, thereby de-coupling and isolating the memory array 10 from its peripheral circuitry. Upon the occurrence of a low level select signal at the input terminal 32, the inverter/latch 114 will continue to output a high signal to maintain the pull-up transistors in conduction until the lower word lines of the memory drop in voltage below the level determined by the reference voltage applied to the word line sensors 116. When this occurs, the inverter/latch 114 releases the bit lines from the source conductor 104, latches and remains latched in this "off" state until the next de-select signal, thereby re-coupling the memory 10 to its peripheral circuits.

As previously discussed, a high level de-select signal applied to the input terminal 32 causes the base voltage of transistor 108 in the chip select gate 34 to become high so that the voltage at the junction of the diode 110 and the resistance 112 is at a high level of $-2\phi$ or $2\phi$ below $V_{cc}$. When a low select signal is applied, transistor 100 will conduct and drop an additional $\phi$ across resistance 106 to place a low $-3\phi$ on the junction of diode 110 and resistance 112. This junction is connected to the base of transistor 134 in the inverter/latch 114. The emitter of transistor 134 is connected to the emitter of NPN transistor 136 and through the constant current source 138 to ground reference. The collector of transistor 134 is connected through a resistance 140 to the $V_{cc}$ source conductor 104 and the collector of transistor 136 is connected through resistor 142 to the conductor 104. The collector of transistor 136 is connected to the output conductor 144 of the inverter/latch 114 and conductor 144 is connected to the bases of the pull-up transistors 146 that interconnect the memory bit lines with the $V_{cc}$ source 104. The collector of transistor 134 is connected to the base of a transistor 148 and through the constant current source 150 to ground reference. The collector of transistor 148 is connected to the positive source conductor 104 and the emitter is coupled to the anode of a diode 152, the cathode of which is coupled to the base of transistor 136, the output conductor 130 of the word line sensors 116, and through a resistance 154 to ground.

CIRCUIT OPERATION

Let it be assumed that a low level chip select signal is being maintained to the input terminal 32 so that the memory chip is in its selected mode. In such a state, the de-biasing circuit 38 output transistor 88 has an emitter level of $2\phi$ that enables all current source transistors, such as transistor 90, and all peripheral circuits are operating normally. The output conductor 144 of the inverter/latch is low and the memory bit line pull-up transistors 146 are off to permit normal operation of the memory.

Upon occurrence of a high de-select signal at input terminal 32, the chip select input gate 34 and inverter/latch 114 rapidly respond to turn on the pull-up transistors 146 within approximately four nanoseconds to de-couple the memory 10 from its various peripheral circuits.

The high input to transistor 98 renders it conductive and transistor 100 is turned off. The level shifter transistor 108 and diode 110 therefore apply a $-2\phi$ to the base of transistor 134. Since the level on the output conductor 130 of the word line sensor 116 is always lower than $-2\phi$, as will subsequently be explained, the transistor 134 will turn on and transistor 136 will turn off to apply a high level to conductor 144 to turn on the pull-up transistors 146 in the memory. The resistor 140 is selected so that the current flowing through this resistor, which is the sum of currents through current source 150 and the conducting transistor 134, results in a low $-1.4\phi$ on the base of transistor 148 and hence a $-3.4\phi$ at the cathode of diode 152 and the base of transistor 136. The high de-select thus operates through two ECL gates each with an approximate two nanosecond delay and the memory bit lines are very rapidly decoupled.

When the high de-select signal is applied to the de-biasing circuit 38, it will turn on transistors 36 and 48 and transistor 50 becomes non-conductive to raise the level at point 54 and the base of transistor 72 to $4\phi$. This applies a $2.8\phi$ to the base of transistor 80, $2\phi$ to transistor 82 and both transistors are turned on to lower the level at point 86 to $1.8\phi$ so that the output level to the current source transistors 90 is $0.8\phi$ thereby turning off power in their respective peripheral circuits and permitting these circuits and the memory word lines to float at a high level. When the memory word lines are at a high level, the transistor 118 in the word line sensor gate 116, as well as the corresponding transistor in the second gate 132, will become conductive to apply a $-2.4\phi$ level to the base of transistors 124 and 125 and therefore a low $-3.4\phi$ level to the conductor 130 and to the base of the off transistor 136 in the inverter/latch 114.

Upon occurrence of a low select input signal, the input transistor 36 of the de-bias circuit 38 is switched off and the transistors 44 and 50 are on to drop the level at point 54 to $2\phi$, at which level the clamping transistor 68 becomes conductive. The emitter of transistor 72 therefore drops to $1\phi$ and the further drop through the diode 83 turns off transistor 82 thereby enabling the point 86 to reach its high $3\phi$ level. Output transistor 88 then provides a high $2\phi$ signal to power up the current source transistor 90.

The low select input signal applied to the chip select input gate 34 turns off transistor 98 and current flow through the enabled transistor 100 and resistor 106 lowers the input level on the base of the transistor 108 from its $V_{cc}$ high level to $-1\phi$. The level shifting action of transistor 108 and diode 110 drops the level to the base of transistor 134 in the inverter/latch 114 from the high of $-2\phi$ to $-3\phi$.

But transistor 134 will remain conducting as long as a high word line level continues to keep a low level on the output line 130 of the word line sensor 116. As long as transistor 134 conducts, transistor 136 is off and the pull-up transistors 146 will remain on. The latching transistor 148 is now in a waiting condition.

When the memory and peripheral circuits have recovered after the reapplication of their respective current sources, the memory word lines will drop to a level below the reference level in the word line sensor 116. Transistor 118 and/or its corresponding transistor in gate 132 will turn off. This lifts the voltage on the base of transistors 124 and 125 to the level of $-1.4\phi$ and thus the output conductor 130 to a level of $-2.4\phi$. When the voltage level on conductor 130 goes higher than the $-3\phi$ level on the base of transistor 134, transistor 136 will conduct and its dropping collector voltage will turn off the pull-up transistors 148.

When transistor 134 becomes non-conductive, the current through resistance 140 and current source 150 results in the base of the latching transistor 148 to be at its high $-0.4\phi$ level. The latch is now operating to hold conductor 130, which is the input to transistor 136, at a $-2.4\phi$ level regardless of word line levels and the switching of the word line sensor gates during normal addressing operations of the memory word lines. The latch is thus set. It can therefore be seen that the conductor 130 will always be at a high level and transistor 136 will be on to disable the pull-up transistors 146 when the bases of transistor 124 and its corresponding transistor 125 in gate 132 are high to set the base of latching transistor 148 high.

The circuitry of the invention has been described for use with a bipolar memory. It should be noted, however, that such a chip power-down control circuit may be used with other types of circuitry for power savings during a deselected period and for providing power restoration and normal circuit operation after reaching a steady and normal operating level. For example, by switching the inputs to the gate transistors 118 and 120 in the word line sensor, the inverter/latch may be made to release the pull-up transistor 146 upon reaching a predetermined high operating level instread of the low word line operating levels as described.

Having thus described our invention, what is claimed is:

1. Power-down control circuitry responsive to chip select and de-select input signals and to controlled circuit voltage levels for rapidly generating a first level output signal in response to a high de-select input signal and for generating a second level output signal only in response to both a low select input signal and predetermined voltage levels from the controlled circuit, said power-down control circuitry comprising:
   input gating means for receiving the select and de-select input signals and for producing output signals at respective third and fourth levels, said third and fourth output levels being independent of the amplitudes of their respective select and de-select input signals;
   controlled circuit voltage sensing means for continually monitoring the voltage levels of said controlled circuit and for producing a fifth predetermined output level when said controlled circuit voltage is lower than a predetermined reference level and a sixth predetermined output level when said controlled circuit voltage exceeds said reference level; and
   controlling circuit means responsive to the output levels of said input gating means and said controlled circuit voltage sensing means for generating the first level output signal in response to said fourth level produced by said input gating means, and for generating a second level output signal when said fifth output level produced by said sensing means exceeds said third level.

2. The circuitry claimed in claim 1 wherein said controlling circuit means includes latching means responsive to a third level output signal from said input gating means and said fifth level for maintaining a second level output from said controlling circuit means regardless of subsequent fifth and sixth level variations from said voltage sensing means until receipt of a fourth level output signal from said gating means.

3. The circuitry claimed in claim 2 wherein said controlling circuit means includes first and second transistors in an ECL gate and wherein said latching means includes a third transistor responsive to a high level at the collector of said first transistor and coupled to the base of said second transistor for latching said base at a high conductive level while said first transistor is non-conductive.

4. The circuitry claimed in claim 3 wherein the controlled circuit is a bipolar memory and wherein said first level generated by said controlling circuit means is a high level signal that de-couples said memory from memory peripheral circuitry by enabling a pull-up transistor coupling each memory bit line to a high voltage level source.

5. The circuitry claimed in claim 4 wherein said controlled circuit voltage sensing means includes at least two circuits each comprising fourth and fifth transistors forming an ECL gate and a sixth transistor responsive to conduction of said fourth transistor for producing said fifth predetermined high output level upon nonconduction of said fourth transistor, the base of said fourth transistor coupled to a lower word line of said memory for monitoring the voltage thereon, the base of said fifth transistor being coupled to a reference voltage that maintains conduction of said fourth transistor until the voltage on said lower word line drops below said reference voltage.

6. The circuitry claimed in claim 5 wherein said controlled circuit voltage sensing means includes two ECL gates, and wherein the fourth transistor in each of said gates is coupled to a memory lower word line, said fith predetermined high output level being produced upon nonconduction of one of said fourth transistors and irrespective of the conduction of the other of said fourth transistors.

7. The circuitry of claim 5 wherein said input gating means includes seventh, eighth and ninth transistors, said seventh and eighth transistors being coupled as an ECL gate responsive to said select and de-select input signals applied to said seventh transistor and a reference voltage level applied to said eighth transistor, said ninth transistor responsive to the non-conduction of said eighth transistor for applying a high predetermined fourth level output to said first transistor in said controlling circuit means.

8. The circuitry claimed in claim 7 further including a de-biasing circuit responsive to said select and de-select input signals for producing a high output signal of a predetermined level in response to a select input signal and a low output signal of a predetermined level in response to a de-select input signal.

9. The circuitry claimed in claim 8 wherein said de-biasing circuitry is coupled to current source transistors associated with peripheral circuits of said memory.

* * * * *